United States Patent
Granhaug et al.

(10) Patent No.: US 9,030,243 B2
(45) Date of Patent: May 12, 2015

(54) PULSE GENERATOR

(75) Inventors: Kristian Granhaug, Oslo (NO); Hakon Andre Hjortland, Oslo (NO)

(73) Assignee: Novelda AS, Oslo (NO)

( * ) Notice: Subject to any disclaimer, the term of this patent is extended or adjusted under 35 U.S.C. 154(b) by 0 days.

(21) Appl. No.: 13/824,284

(22) PCT Filed: Sep. 20, 2011

(86) PCT No.: PCT/GB2011/051761
§ 371 (c)(1),
(2), (4) Date: Jul. 18, 2013

(87) PCT Pub. No.: WO2012/038732
PCT Pub. Date: Mar. 29, 2012

(65) Prior Publication Data
US 2013/0285728 A1    Oct. 31, 2013

(30) Foreign Application Priority Data

Sep. 20, 2010   (GB) .................................. 1015729.5

(51) Int. Cl.
*H03K 3/017*  (2006.01)
*H03K 5/04*   (2006.01)
(Continued)

(52) U.S. Cl.
CPC ................ *H03K 5/065* (2013.01); *H03K 5/159* (2013.01); *H04B 1/7174* (2013.01)

(58) Field of Classification Search
CPC .............. H03K 7/0812; H03K 17/164; H03K 2005/00065; H03L 7/0895; H03L 7/0891; H04B 1/7174
USPC .......................... 327/276, 277, 278, 172, 175
See application file for complete search history.

(56) References Cited

U.S. PATENT DOCUMENTS 3,495,076 A    2/1970   Jespers et al.
4,097,801 A    6/1978   Freeman et al.
(Continued)

FOREIGN PATENT DOCUMENTS

DE    3339985 A1    5/1985
EP    0606979 A2    1/1994
(Continued)

OTHER PUBLICATIONS

Chong et al., "Potential of UWB Technology for the Next Generation Wireless Communications," 2006 IEEE Ninth International Symposium on Spread Spectrum Techniques and Applications, Aug. 2006, 8 pages.
(Continued)

*Primary Examiner* — John Poos
(74) *Attorney, Agent, or Firm* — Klarquist Sparkman, LLP

(57) ABSTRACT

A pulse generator comprising: an input for receiving a trigger; an output node for outputting a signal; a delay line comprising one or more delay units and a plurality of taps; one or more pull-up devices each connected to the output node for increasing the output voltage on the output node; and/or one or more pull-down devices each connected to the output node for decreasing the output voltage on the output node; wherein the taps of the delay line are operably connected to the pull-up and/or pull-down devices such that a trigger passing along the delay line activates one or more of the pull-up and/or one or more of the pull-down devices more than once. Re-use of the pull-up and/or pull-down devices enables longer and more complex pulse shapes, such as high-order Gaussian pulse shapes to be produced while keeping the number of components low, thus reducing chip area, power requirements and parasitic capacitance.

46 Claims, 10 Drawing Sheets

(51) Int. Cl.
*H03K 7/08* (2006.01)
*H03K 5/06* (2006.01)
*H03K 5/159* (2006.01)
*H04B 1/717* (2011.01)

(56) References Cited

U.S. PATENT DOCUMENTS

| | | | |
|---|---|---|---|
| 4,322,852 | A | 3/1982 | Barnes |
| 5,451,894 | A | 9/1995 | Guo |
| 5,953,368 | A | 9/1999 | Sanderford et al. |
| 5,953,370 | A | 9/1999 | Durrant et al. |
| 6,041,092 | A | 3/2000 | Tsai et al. |
| 6,100,735 | A | 8/2000 | Lu |
| 6,115,113 | A | 9/2000 | Flockencier |
| 6,121,808 | A | 9/2000 | Gaudet |
| 6,169,438 | B1 | 1/2001 | Wu et al. |
| 6,281,726 | B1 | 8/2001 | Miller, Jr. |
| 6,441,657 | B1 | 8/2002 | Saeki |
| 6,658,053 | B1 | 12/2003 | Aiello et al. |
| 6,798,258 | B2 | 9/2004 | Rieven |
| 7,026,850 | B2 | 4/2006 | Atyunin et al. |
| 7,378,893 | B1 | 5/2008 | Kang |
| 7,439,787 | B2 | 10/2008 | Hashim et al. |
| 7,449,932 | B2 | 11/2008 | Ikeda |
| 7,453,297 | B1 | 11/2008 | Kaviani |
| 7,605,625 | B2 | 10/2009 | Pellerano et al. |
| 7,642,831 | B2 | 1/2010 | Nguyen |
| 7,746,144 | B2 | 6/2010 | Jimenez et al. |
| 7,872,494 | B2 | 1/2011 | Welker et al. |
| 7,893,741 | B2 | 2/2011 | Cao et al. |
| 7,893,744 | B2 | 2/2011 | Nakamura et al. |
| 8,248,136 | B1 | 8/2012 | Zhang et al. |
| 8,461,894 | B1 | 6/2013 | Zhang et al. |
| 2002/0190762 | A1* | 12/2002 | Mooney et al. ............ 327/108 |
| 2002/0196061 | A1 | 12/2002 | Atyunin et al. |
| 2005/0220229 | A1 | 10/2005 | Goto |
| 2007/0030043 | A1 | 2/2007 | Takai et al. |
| 2007/0210848 | A1 | 9/2007 | Jimenez et al. |
| 2007/0248195 | A1 | 10/2007 | Lerner et al. |
| 2008/0049850 | A1 | 2/2008 | Sidiropoulos et al. |
| 2009/0096292 | A1 | 4/2009 | Ikeda |
| 2009/0135974 | A1 | 5/2009 | Mimura et al. |
| 2009/0219061 | A1 | 9/2009 | Ikeda |
| 2009/0296860 | A1 | 12/2009 | Chester et al. |
| 2010/0141306 | A1 | 6/2010 | Doi et al. |
| 2012/0212356 | A1 | 8/2012 | Killat et al. |
| 2012/0230450 | A1 | 9/2012 | Sidiropoulos et al. |
| 2013/0181746 | A1 | 7/2013 | Granhaug et al. |
| 2013/0287151 | A1 | 10/2013 | Granhaug et al. |
| 2013/0293275 | A1 | 11/2013 | Granhaug et al. |

FOREIGN PATENT DOCUMENTS

| | | |
|---|---|---|
| EP | 0703663 A1 | 3/1996 |
| EP | 2034686 A2 | 3/2009 |
| GB | 2265029 A | 9/1993 |
| WO | WO 99/39438 A1 | 8/1999 |
| WO | WO 03/041276 A2 | 5/2003 |
| WO | WO 2006/080904 A1 | 8/2006 |
| WO | WO 2007/088211 A1 | 8/2007 |

OTHER PUBLICATIONS

Kim et al., "Fifth-Derivative Gaussian Pulse Generator for UWB System," 2005 IEEE Radio Frequency Integrated Circuits Symposium, Jun. 2005, 4 pages.

Win et al., "Comparison of Analog and Digital Impulse Radio for Wireless Multiple-Access Communications," IEEE International Conference on Communications, Montréal, Canada, Jun. 1997, 5 pages.

* cited by examiner

PULSE GENERATOR

CROSS REFERENCE TO RELATED APPLICATIONS

This is the U.S. National Stage of International Application No. PCT/GB2011/051761, filed Sep. 20, 2011, which was published in English under PCT Article 21(2), which in turn claims the benefit of GB Application No. 1015729.5, filed Sep. 20, 2010.

The invention relates to pulse generators (PG) particularly to pulse generators suitable for CMOS implementation. More specifically it relates to pulse generators for generating impulse radio/radar ultra wideband (IR-UWB) pulses in low power integrated transmitters. The preferred arrangements described herein are scalable both in bandwidth and centre frequency while maintaining reasonable output power.

UWB communications technology has been in active development ever since the Federal Communication Commission (FCC) released a large unlicensed UWB spectral mask (3.1-10.6 GHz). Similar bands have also been released for unlicensed use in other countries, but outside the US unlicensed bands are significantly limited.

For example, in Europe the unlicensed band extends from 6 to 8.5 GHz, in Japan from 7.25 to 10.25 GHz and in Korea from 7.2 to 10.2 GHz. Taking all of these restrictions into account, the only spectrum that is freely available in all of these countries is from 7.25 to 8.5 GHz. It is therefore desirable to produce a common architecture that can be used in all of these jurisdictions, but can be readily scaled and tuned to an appropriate bandwidth and centre frequency to make the maximum use of the allowed bands.

A particularly useful pulse shape in UWB applications is the Gaussian pulse shape. One advantage of this pulse shape is that it has no sideband interference. FIG. 1 shows a Gaussian pulse together with the first 15 derivative Gaussian pulses (i.e. pulses having shapes of the first 15 derivatives of the Gaussian function). By decreasing the width of the pulse, the frequency is shifted upwards, while the order of the derivative changes the width of the frequency band. A higher order Gaussian will give a reduced bandwidth. In this way whatever bandwidth is required may be established by a Gaussian pulse.

One important observation is that the envelope of any higher order Gaussian pulse is also a Gaussian pulse as shown in FIG. 2. In fact, the transmitted bandwidth is primarily determined by the width of the Gaussian envelope (inversely proportional).

While the centre frequency of the band is determined primarily by the inherent frequency of the higher order Gaussian which is shaped by the envelope.

One way of creating a higher order Gaussian pulse shape is to generate a particular frequency with an oscillator and then shape that with a Gaussian envelope. However, oscillators consume a lot of power and chip area.

A major challenge for cost-efficient IR-UWB devices is the creation of single chip CMOS solutions exploring state-of-the-art digital technology. CMOS technologies at nanometer technology node use a supply voltage of about 1V. With this low supply voltage, it is difficult to make pulse generators at microwave frequencies with sufficient energy to reach the allowed FCC part 15 limit (−41.3 dBm/MHz).

"A Varying Pulse Width 5th-Derivative Gaussian Pulse Generator for UWB Transceivers in CMOS", by Haolu Xie et al, Proc. IEEE Radio and Wireless Symposium (RWS), pp 171-174, 2008, describes a 5th order derivative Gaussian pulse generator using four individually driven transistors for pulling up and pulling down a common output node. The timing of the pull-up/pull-down pairs are set by separate delay sequences. However the measurements shown in this paper indicate spectral filling that is significantly below the allowed emission.

"A Tunable CMOS UWB Pulse Generator" by H. Kim et al, The 2006 IEEE International Conference on Ultra-wideband, uses starving inverters organized in a delay line configuration. However, the use of these slow inverters will mean poor performance at microwave UWB frequencies. Also this design does not scale well to different Gaussian derivatives and different frequency bands and centre frequencies.

According to a first aspect of the invention, there is provided a pulse generator comprising: an input for receiving a trigger; an output node for outputting a signal; a delay line comprising one or more delay units and a plurality of taps; one or more pull-up devices each connected to the output node for increasing the output voltage on the output node; and/or one or more pull-down devices each connected to the output node for decreasing the output voltage on the output node; wherein the taps of the delay line are operably connected to the pull-up and/or pull-down devices such that a trigger passing along the delay line activates one or more of the pull-up and/or one or more of the pull-down devices more than once.

The present invention omits the oscillator and thereby implements a power efficient pulse generator. The omission of an oscillator simplifies the pulse generator circuit as well as saving power. The solution proposed by the invention is therefore a simple and viable pulse generator design scheme which is readily adaptable to different bandwidths and different regulations.

By triggering one or more of the pull-up and/or one or more of the pull-down devices more than once by the sequence of taps of the delay line the devices are essentially re-used during the formation of a single multi-slope pulse. This device re-use reduces the number of devices required for a particular pulse generator. For example if the overall pulse shape requires two individual pulses to be generated by a device of strength 3, then the circuit only needs to provide a single strength 3 device—the two taps corresponding to the two individual pulses in question are both connected to the same device.

Where the desired pulse shape involves a large number of oscillations (i.e. many peaks and troughs or zero-crossings) such as for higher order Gaussian pulses, a long delay line and a significant number of devices will be required. However, as the number of devices increases, the parasitic capacitance of the circuit as a whole increases. The chip area and the power consumption also increase with the number of components. These limitations quickly mount up to counteract the benefits of the circuit. In particular the parasitic capacitance of the devices slows the circuit down and prevents proper operation. Therefore for longer pulse shapes with a greater number of peaks and troughs, device re-use rapidly becomes an important requirement, e.g. for generation of higher order Gaussian pulse shapes to obtain good spectral filling of the narrower UWB bandwidths.

Preferably the pulse generator comprises at least one pull-up device and at least one pull-down device. Although embodiments with only pull-up or only pull-down devices can still be useful, the use of both pull-up and pull-down devices allows steep slopes to be generated in both directions and provides for more versatile waveform generation.

In preferred embodiments the delay line taps are operably connected to the pull-up and pull-down devices such that a trigger passing along the delay line causes a sequence of device activations that alternates between increasing the voltage on the output node and decreasing the voltage on the output node. Preferably the pulse generator comprises a plurality of pull-up devices. Preferably the pulse generator comprises a plurality of pull-down devices.

By pulling the output signal alternately up and down (e.g. by triggering alternate pull-up and pull-down devices), a multi-slope pulse shape can be created. The delay line provides a neat way of arranging the necessary triggering sequence and it can be implemented with a relatively small number of low power components which occupy a small chip area. The absence of an oscillator component significantly reduces power consumption as when the transmitter is not active, the only power consumption is through current leakage. Further, the small number of components reduces the chip area required for the circuit. This has the benefits of reducing production cost and increasing production quality. The physical properties of larger chips vary more and so by keeping the chip area minimised the operation of the circuits can be kept more consistent. A major advantage of the delay line arrangement is that it scales to higher order pulse shapes (i.e. those with a larger number of peaks and troughs) by extending the delay line and adding more pull-up/pull-down devices. Previous studies have found it difficult to generate higher order pulses.

In some preferred embodiments the or each device may be connected to the delay line taps such that it activates and deactivates based on a signal from the same tap. This is the case for a direct connection from the delay line to the device, with a pulsed trigger signal being sent down the delay line. It is also the case where the delay line tap triggers a one shot device (using a pulse or an edge trigger) which in turn powers the device. This can provide for a compact structure with small numbers of delays and taps.

In alternative embodiments, the or each device may be connected to the delay line taps such that it activates based on the signal from one tap and deactivates based on the signal from a subsequent tap. This allows the device drive times to be determined from the delay line and therefore makes for a compact device. With this arrangement the driving pulses may overlap slightly. For example a pulse for driving a pull-down device may begin before the end of a pulse for driving a pull-up device. Ideally the pulses would be timed with no overlap and no gap between them. However where this cannot be avoided an overlap is preferred to a gap as its effect is only to affect the slope or the amplitude slightly, whereas a gap could introduce extra strong frequency components, creating sideband noise. The overlap should preferably be minimised or even eliminated.

Preferred embodiments provide combinatorial logic to determine which devices are triggered (activated) by which delay line taps. For example if a particular device is to be triggered by two different delay line taps in the sequence, an OR gate could be used with the two taps as inputs and with the output used to drive the device. A person of ordinary skill in the art will readily be able to use standard logic gates (e.g. but not limited to AND, OR, NAND, NOR, NOT, XOR, XNOR) to combine the triggers in a suitable fashion for the desired pulse shape. For high speed implementations, preferably the logic is arranged to use only NOR, NAND and NOT gates as OR, AND and XOR gates suffer from higher propagation delay.

Many of the most desirable pulse shapes are symmetrical or nearly symmetrical in time. In preferred embodiments therefore, the delay line is essentially folded back on itself, with the second half of the delay line triggering the same devices as were triggered in the first half of the delay line but in reverse (or substantially reverse) order. This arrangement allows for a high amount of device re-use and can therefore produce higher order pulse shapes at higher frequencies.

In some circumstances it may be possible to use an odd number of delay line taps where the operation of the central tap is not mirrored, but the remaining taps are mirrored (as in the sequence "1, 2, 3, 2, 1" where 1 and 2 are mirrored, but 3 is not). In other embodiments, an even number of delay line taps is provided, whereupon the mirroring becomes more complex as it is desirable to maintain the alternation between pull-up and pull-down. However, suitable use of combinatorial logic can achieve this. Preferably therefore the delay line taps of the first half of the delay line are grouped into sequential pairs, each pair containing a pull-up tap and a pull-down tap, and wherein each tap of the second half of the delay line is arranged to trigger the same devices as a trigger of the first half of the delay line, but with the triggering order arranged such that the sequence of pairs is reversed, but the sequence within each pair remains the same, said order being achieved by the combinatorial logic. An example sequence may be "(U1, D1), (U2, D2), (U3, D3), (U3, D3), (U2, D2), (U1, D1)" where U represents pull-up and D represents pull-down and brackets indicate pairing. The pairs are mirrored, but within each pair the order U then D is maintained. An even number of taps leads to an odd order derivative and a pulse which is anti-symmetric in time. An odd number of taps leads to an even order derivative and a pulse which is symmetric in time.

In many instances, adjacent peaks and troughs of the desired pulse shape are not significantly different. Therefore, in other preferred embodiments the pull-up and pull-down devices may be re-used by adjacent pairs of delay line taps. In other words, the delay line taps are grouped into pairs of adjacent taps and the pulse generator is arranged such that at least one pair of taps uses the same pull-up and pull-down devices as an adjacent pair of taps. This arrangement generates the same peak and trough sequence a number of times to approximate a desired slowly varying pulse envelope. For example instead of triggering devices U1, D1, U2, D2, U3, D3, U4, D4, the sequence U1, D1, U1, D1, U3, D3, U3, D3 may be used as an approximation. Devices U2, D2, U4 and D4 are therefore not required, thus reducing chip area and power consumption at the expense of a slightly more crude approximation. However in many instances, the crudeness of the approximation does not greatly affect the spectral properties of the pulse and therefore the size and power gains are beneficial.

For the best pulse shape accuracy, all peaks and troughs should be reproduced as precisely as possible. However, a further simplification which can be made to the architecture at the expense of accurate pulse reproduction is to omit weaker pulses. Therefore in preferred embodiments, the arrangement of pull-up and pull-down devices for approximating a derivative Gaussian pulse may omit devices for the outermost peaks (or troughs). As these peaks and troughs are only of low amplitude, they do not contribute much power to the overall pulse shape and therefore this loss is not significant compared to the speed increase gained by reduction of the parasitic capacitance and the ease of implementation. There will also be a small reduction in chip area and a reduction in power obtained by reducing the number of components of the circuit. The number of outermost peaks and troughs which are omitted can be selected according to the desired degree of accuracy in the approximation. For example it may be a single peak or trough at only one end, or one peak or trough at each end, or more than one peak/trough at each end. For example in high order Gaussian pulse shapes where the overall Gaussian envelope severely restricts the amplitude of the individual pulses (i.e. the peaks and troughs), a number of individual pulses within the overall pulse shape may be omitted without greatly reducing the overall transmitted power of the pulse.

The pull-up and pull-down devices may all have the same strength, thus creating a train of substantially identical height peaks and troughs within the pulse. However, in preferred embodiments the plurality of pull-up and pull-down devices have different strengths such that stronger devices respectively increase or decrease the output voltage more than weaker devices. With this arrangement for example a strong pull-up device can create a large (high amplitude) peak and a weak pull-down device can create a small (low amplitude) trough. The pulse shape can therefore easily be varied simply by component design.

In this way, virtually any sequence of peaks and troughs can be generated according to the desired use. For example, the peak amplitudes can be ramped up or ramped down or they can be alternated in various ways. In some preferred embodiments, the pull-up and pull-down devices are arranged such that the strongest devices are in the central region of the delay line and the strength of the devices decreases towards the ends of the delay line. This creates a pulse shape with a number of peaks and troughs whose amplitudes increase towards a central maximum before decreasing again.

In one of the more simple arrangements, the taps of the delay line each drive a single pull-up or pull-down device and the taps alternate between connection with one of the pull-up devices and connection with one of the pull-down devices. However, in preferred embodiments one or more taps of the delay line may be connected to a plurality of pull-up devices. Similarly, one or more taps of the delay line may be connected to a plurality of pull-down devices. This allows further sharing of the devices by the taps and allows devices of different strengths to be driven alone or in combination to achieve a greater range of strengths. For example, devices of strength 1, 2 and 4 can be used alone or can be used in combination to produce any combined strength of up to 7 (using arbitrary units). This allows a greater flexibility in pulse shaping while maintaining low chip area and low power consumption. As described above, as more devices are added, the load capacitance of the circuit increases (when one device is firing, the others are all load). This slows down operation and reduces the upper frequency limit of operation. Therefore for higher frequency operation it is important to reduce the number of devices. Re-use of devices as described above helps to reduce the number of devices and thereby allows higher frequency operation.

The delay line taps can be classified as pull-up taps or pull-down taps, i.e. a pull-up tap drives one or more pull-up devices (and does not drive any pull-down devices) and a pull-down tap drives one or more pull-down devices (and does not drive any pull-up devices).

The pull-up and pull-down devices are stand-alone devices, i.e. they are not part of a complementary pair (e.g. they are not part of a complementary PMOS-NMOS buffer). Complementary pairs where there is always one device on and one device off simply introduce additional unnecessary devices and unwanted parasitic capacitance.

In particularly preferred embodiments, the strengths of the pull-up and pull-down devices are arranged to form an approximate derivative Gaussian pulse shape. Derivative Gaussian pulses are of particular use in ultra wideband applications because the frequency spectrum provides good filling of the permitted UWB spectral mask. Increasing the order of the Gaussian derivative decreases the bandwidth of the spectrum. For example, to achieve good spectral filling of the indoor US bandwidth (3.1-10.6 GHz), 5th to 7th order pulses are theoretically required, whereas to achieve good spectral filling of the European bandwidth (6-8.5 GHz) much higher, e.g. theoretically greater than 15th order pulses should be used.

It should be noted that even where practical implementations do not achieve such high order pulses, better filling will be achieved through the use of higher order pulses.

As described above, a Gaussian derivative pulse is one where the pulse shape resembles the derivative of a Gaussian function. As the order of the derivative increases, the number of peaks and troughs within the pulse shape increases, but the overall shape of the envelope of the amplitudes remains as a Gaussian function. According to the preferred embodiments of the invention, this shape is approximated by arranging the strengths of the pull-up and pull-down devices so as to have amplitudes matching the Gaussian envelope. This essentially approximates the derivative Gaussian waveform using pulses of appropriate amplitudes. At high frequencies, the shapes of each of the individual peaks and troughs is a function of the local parasitic capacitance and is quite rounded.

The pull-up and pull-down devices may operate in any way so as to pull the output voltage in the correct fashion. For example, the devices may include any kind of static or variable voltage supply or voltage controller, including batteries or voltage rails, or other voltage-defining circuitry. Transistors may be used as part of the voltage-defining circuitry. Transistors may be considered as voltage controlled current sources.

The invention may be implemented using bipolar transistors, but preferably JFETs or MOSFETs are used to reduce current leakage. In the most preferred embodiments, the invention is implemented using CMOS technology for the lowest power consumption.

As described above, the pull-up and pull-down devices may comprise voltage supplies. Preferably the relative strengths of the devices can then be determined by the strengths of the voltage supplies. In other embodiments the strengths of the devices may be altered by the design of the components, e.g. by using relatively weaker and stronger FETs. The strength of FETs can be altered simply by changing the physical size of the components. In this way the devices may all be attached to common sources or potentials for simpler circuit design. A combination of these techniques (strength of component and strength of source) may be used.

In the most simple arrangements, the signals from the delay line taps themselves are used to trigger the pull-up and pull-down devices. For such an embodiment a pulse would normally be delivered to the delay line (e.g. a rising edge followed by a falling edge, or vice versa). However, in long delay lines, a pulse which propagates down the delay line may change properties, e.g. it may increase or decrease in length. This can affect the reliability of the triggering and could degrade the generated signal. To maintain a more consistent signal, each device is preferably triggered by the output of a one-shot circuit which is itself triggered by the delay line or the combinatorial logic. The one-shot circuit may be set to trigger reliably by a rising edge or a falling edge. In response to that trigger, each one-shot generates its own output pulse to drive the relevant device. With this arrangement it is also possible by design of the one-shots to vary the pulses delivered to the various devices, thereby allowing the strengths of those devices to be varied, e.g. by lengthening or shortening the driving pulses from the one-shots.

The one-shot devices may be separate components on the circuit, but as a typical one-shot device incorporates a delay element, the one-shot circuits preferably utilize the delay units from the delay line. This arrangement reduces the number of components and therefore the chip area and power consumption. However, this arrangement has the further advantage that the length of the one-shot pulse can be closely correlated with the time between firing adjacent pull-up and pull-down devices. This allows high frequency waveforms to be generated.

The pulse generator circuit as a whole preferably has a capacitance for smoothing the output signal. A capacitor may therefore be connected to the output node. However, in most preferred embodiments, the parasitic capacitance of the circuit is enough for this purpose and no further capacitor is required.

Preferably the output node is biased to a selected base potential above ground, e.g. by using biasing resistors. For most efficient operation, the base potential is preferably centered between the high and low rails. This allows for the largest swings in voltage and therefore the highest energy pulses.

Each delay unit of the delay line preferably comprises a series of one or more inverters. For high speed (and therefore high frequency) operation, these inverters are preferably as simple as possible and therefore as small (in terms of circuit area) as possible. Preferably non-current-starving inverters are used. Preferably each inverter is a CMOS inverter and preferably comprises a single PMOS and a single NMOS transistor.

The asynchronous (non-clocked) nature of the invention means that the pulse generator operates in continuous time. The avoidance of clocks allows for faster operation and lower power consumption.

According to a second aspect, the invention provides a method of generating a pulse comprising: sending a trigger along a delay line; tapping the trigger off the delay line at a plurality of tap points; and using the taps to drive one or more pull-up and/or one or more pull-down devices which are connected to a common output node for respectively increasing and decreasing the output voltage on the output node, wherein the trigger activates one or more of the pull-up and/or one or more of the pull-down devices more than once.

The preferred features and elements of the invention described above in relation to the apparatus all apply equally well to the method. Further, the preferred features and elements described above may readily be combined together in any combination.

Preferred embodiments of the invention will now be described, by way of example only, and with reference to the accompanying drawings in which.

Figure 1:
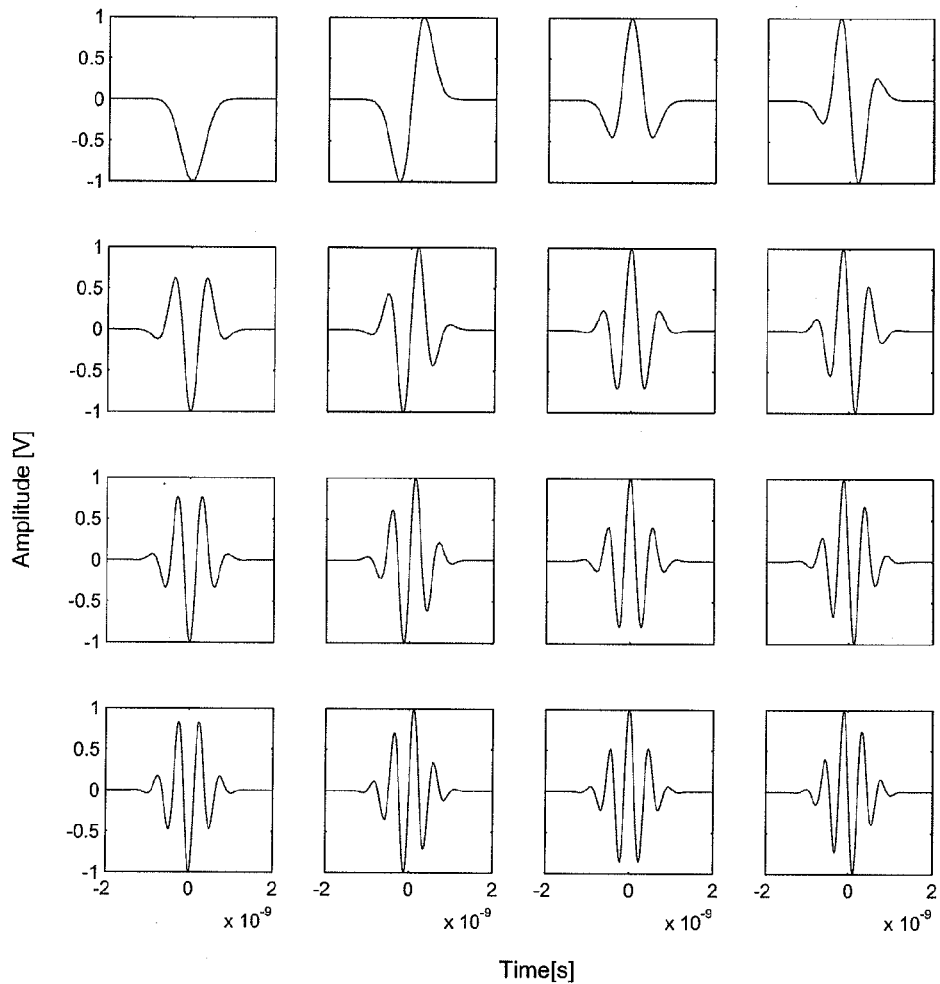
FIG. 1 shows a Gaussian pulse shape and first to fifteenth derivative Gaussian pulse shapes.
Figure 2:
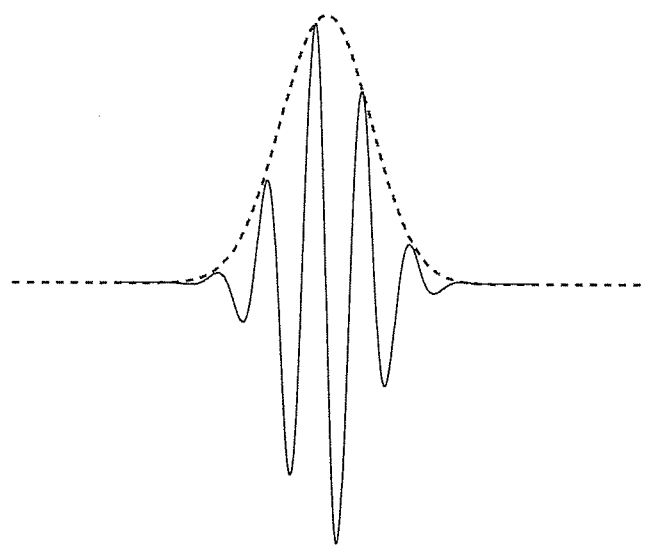
FIG. 2 shows a high order Gaussian pulse shape with the Gaussian envelope.

FIG. 1 shows a series of Gaussian pulses of different orders (different derivatives), starting with the basic Gaussian pulse shape in the upper left corner and proceeding with the first, second and third derivatives towards the right in the first row. The second, third and fourth rows respectively show the 4th-7th, 8th-11th and 12th-15th derivatives. As can be seen, the higher order derivatives have an increasing number of peaks and troughs (i.e. a higher number of individual pulses within the overall pulse shape) and therefore have higher frequency components. These higher order derivative pulses also have progressively decreasing bandwidth. A common feature of all of these pulses is the Gaussian envelope into which the individual oscillations fit. This is illustrated in FIG. 2. which shows a high order Gaussian pulse in solid line and the Gaussian envelope in dashed line.

Figure 3:
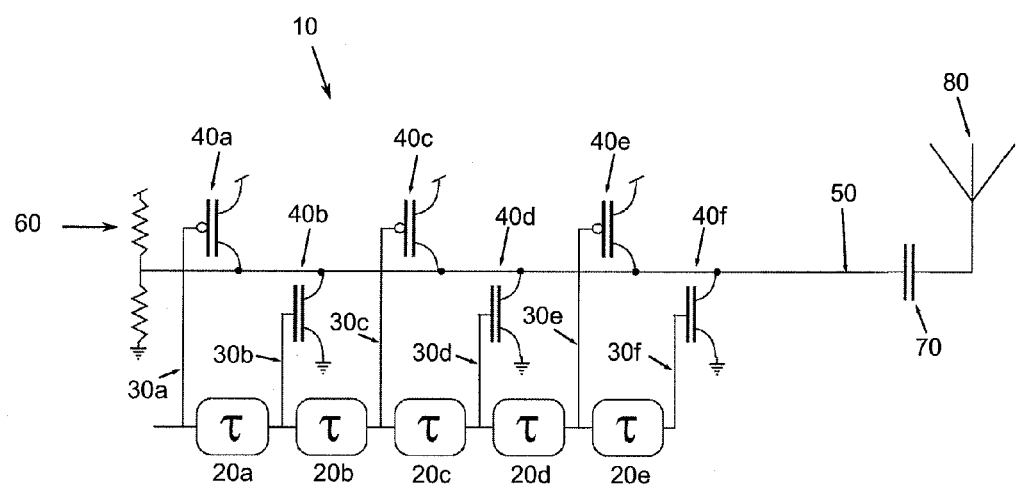
FIG. 3 shows a delay line based pulse generator illustrating some fundamental features of the invention.
Figure 3:
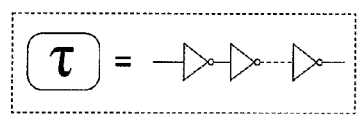

The basic delay line structure of the invention is illustrated in FIG. 3. The delay line 10 is made up of a number of individual delay units 20a-e. Delay line taps 30a-f are taken from the delay line 10 at intervals separated by the delay units 20a-e. Each delay line tap 30a-f is connected to a pull-up or pull-down device 40a-f which is arranged to pull the output voltage of the output node 50 away from its equilibrium position. 40a, 40c, 40e, are pull-up devices taking the form of PMOS transistors which selectively connect the output node 50 to a higher potential while 40b, 40d, 40f are pull-down devices taking the form of NMOS transistors which selectively connect the output node 50 to a lower potential, in this case to ground. The pull-up and pull-down devices are stand-alone devices, i.e. they are non-complementary and simply provide the pull-up or pull-down function. If no trigger is applied on a given tap to drive the appropriate device(s), the output is not pulled up or down. The equilibrium state of output node 50 is set by bias resistors 60. An antenna 80 is connected to the output node 50 through a coupling capacitor 70.

In operation, a trigger pulse (comprising a rising edge and a falling edge) is transmitted down the delay line 10, passing from left to right as shown in the figure. Each pull-up and pull-down device 40a-f is triggered in turn with the separation between device triggering being determined by the delay in the delay units 20a-e. As the trigger pulse propagates down the delay line 10, the delay line taps 30a-f trigger the devices 40a-f in sequence. As each tap is connected to the gate of the corresponding device transistor, each device 40a-f in turn is triggered to conduct and thereby to drive the voltage of output node 50. As can be seen, the sequence of taps 30a-f and devices 40a-f is such as to drive the output voltage of the output node 50 alternately above and below its equilibrium position. First, pull-up device 40a is triggered, the transistor switches on and charge flows onto the output node 50 and capacitor 70, raising the voltage of output node 50. As the trigger pulse passes along the delay line 10 the device 40a switches off. After one delay unit 20a, the trigger pulse activates the second device, i.e. pull-down device 40b. The transistor switches on and charge flows off the output node 50 and capacitor 70, thus dragging the voltage of output node 50 down towards ground. Third, after delay unit 20b, pull-up device 40c is triggered, again raising the voltage of output node 50 back up above its base voltage. Thus pull-up and pull-down devices are triggered in sequence.

The sequence progresses in this same fashion, through devices 40d to 40f, oscillating above then below its equilibrium voltage with the timings determined by delay units 20c-e. In this way, the common output node is caused to oscillate between a series of highs and lows, thus generating a multi-slope pulse shape. In line with the voltage of output node 50, the antenna 80 radiates an electromagnetic pulse of corresponding shape. The trigger pulse is typically a square pulse of an appropriately chosen height and width corresponding to the requirements of the devices and the delay lengths of the delay units 20. The delay time of the delay units sets the separation of the individual pulses within the overall pulse shape and therefore sets the centre frequency of the overall output pulse.

It will be appreciated that certain aspects of this circuit may be altered without departing from the invention, e.g. the equilibrium voltage of the output node may be set in any way, not necessarily using biasing resistors 60. The pull-up and pull-down devices 40a-f do not have to be transistors, but could be any arrangement which causes the appropriate raising or lowering of the voltage on the output node 50. The coupling capacitor 70 may be omitted depending on the circuit arrangement. For example if a monopole antenna is used, the coupling capacitor may be omitted. On the other hand, if a loop antenna is used, the coupling capacitor may be required. A smoothing capacitor may be placed in parallel with the circuit (not shown), but in most cases can in fact be omitted where the capacitance of the circuit as a whole (parasitic capacitance) is sufficient to provide the required smoothing.

As illustrated in the inset of FIG. 3, the delay units are each constructed from a series of inverters, although again this should not be taken as limiting. Inverters provide the shortest digital delays possible and are therefore preferred for the highest frequency operations. However for lower frequency operations the delay units may include larger slow circuits.

As discussed, the length of the delay units affects the centre frequency of the pulse shape. With this architecture therefore, the centre frequency can easily be tuned by design of the unit delay length. This delay length (and centre frequency) can be set in the factory and therefore remain constant for a given product. However, such designs are vulnerable to production spread and temperature dependence. Therefore preferably a tunable delay line may be used so that a given product can adjust its frequency according to the desired use and can compensate for variations. Alteration of centre frequency may be accomplished by tuning the individual delay units of the delay line or by creating a "programmable" delay line comprising a plurality of delay lines each arranged for a certain centre frequency. These individual delay lines can then be multiplexed so as to allow selection of an appropriate centre frequency for the pulse generator. Both of these techniques may be used in combination.

The use of an inverter based delay line rather than a clock allows operation at higher frequencies. For example, the present invention can readily achieve operation at up to 6-8 GHz. This clockless implementation is also more power efficient.

Consider the chain of inverters illustrated in FIG. 3. A typical inverter in modern technology can have a delay of the order of 10 ps. Therefore, by cascading inverters, larger delays can be generated. For example, allowing 25% increased delay for parasitic capacitance of the wiring (although this could be up to 50% in some cases), ten cascaded inverters would provide a total delay of 125 ps. Using this delay in the pulse generator of FIG. 3 would generate a pulse with a centre frequency of 4 GHz.

Figure 4:
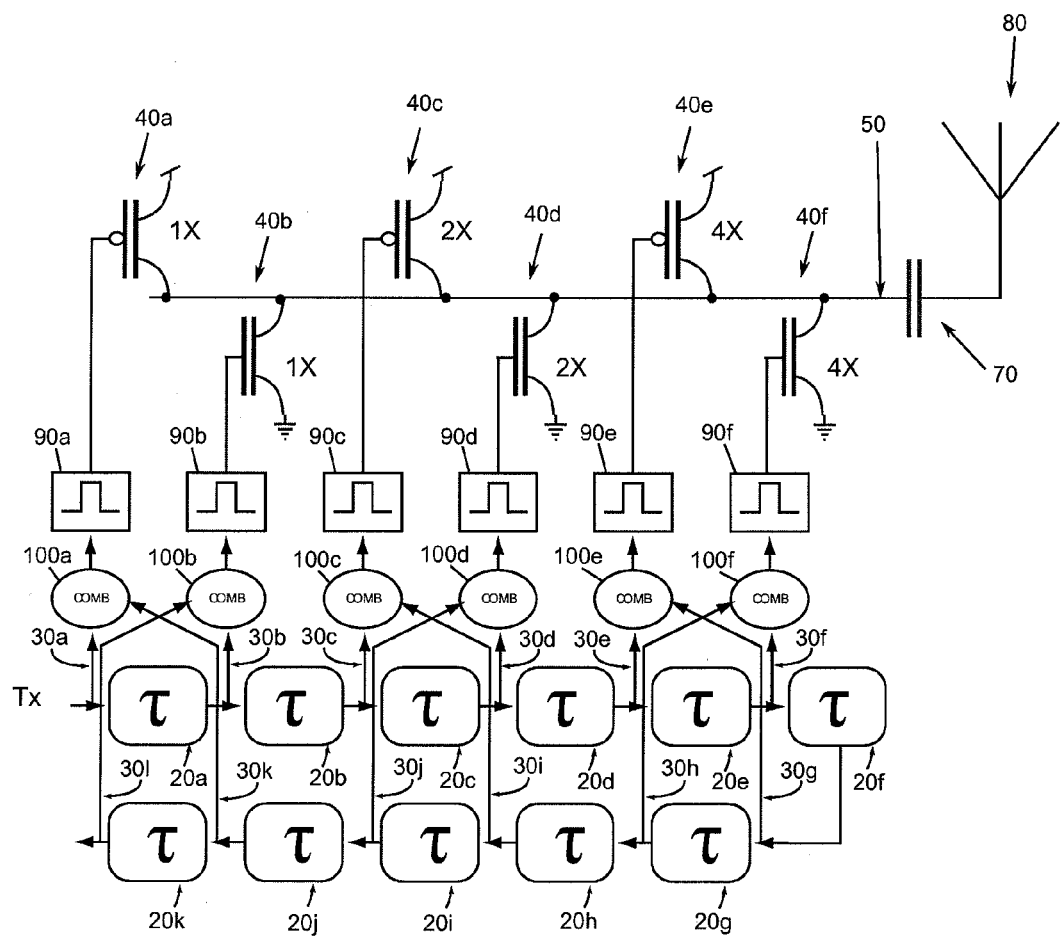
FIG. 4 shows an embodiment of the invention employing driver re-use through folding.

FIG. 4 shows an embodiment of the invention using the basic principle of FIG. 3, but with three important differences. The three differences are 1) the strengths of the pull-up and pull-down transistors 40a-f are varied along the length of the circuit, 2) the transistors 40a-f are triggered by one-shot circuits 90 rather than directly triggered by the delay line 10 and 3) the delay line 10 has been folded so as to re-use the drivers 40a-f.

To describe these features in more detail, firstly the transistors 40a-f are shown with different weightings (strengths)—the first pair of pull-up and pull-down transistors 40a, 40b have strength x1, the second pair 40c, 40d have strength x2 and the third pair 40e, 40f have strength x4. As the trigger pulse progresses along the delay line 10, the output node 50 is pulled up or down with greater strength and therefore the amplitude of the output pulse (i.e. the voltage on the output node 50) increases accordingly.

Secondly, the pull-up and pull-down transistors 40a-f are triggered by one-shot circuits 90a-f which are in turn triggered by the delay line 10 (each one-shot circuit 90a-f being triggered by a different tap 30a-l). The one-shot circuits 90a-f are robust to the input trigger from the delay line 10 and they each produce a reliable and consistent pulse for driving the transistors 40a-f. It should be noted that, depending on the particular arrangement, the trigger may be a pulse or it may just be an edge (rising or falling). In some embodiments, the trigger may vary between delay line taps, e.g. it may alternate between a rising edge and a falling edge.

Thirdly, the second half of the delay line 10 is folded back on the first half so as to re-use the pull-up and pull-down transistors 40a-f which were used in the first half of the delay line 10. As is shown, to preserve the alternating order of pull-up and pull-down the second half of the delay line has to switch the order of each pair of pull-up and pull-down transistors 40a-f so that the triggering order is not an exact mirror image. As each transistor 40a-f can be triggered by either of two delay line taps 30a-l, combinatorial logic units 100a-f are provided to combine the delay line taps 30a-l and trigger the appropriate one-shot circuit 90a-f. Each logic unit in this instance could be a simple OR gate.

The delay line 10 of FIG. 4 is longer, i.e. it comprises more delay units 20a-k and more taps 30a-l. However, the same number of devices 40a-f are used as in FIG. 3. In this embodiment each device 40a-f is triggered twice in the course of one multi-slope pulse generation, once by each of two delay line taps 30a-l. The sequence progresses as follows:

|  | Tap | | | | | | | | | | | |
| --- | --- | --- | --- | --- | --- | --- | --- | --- | --- | --- | --- | --- |
|  | 30a | 30b | 30c | 30d | 30e | 30f | 30g | 30h | 30i | 30j | 30k | 30l |
| Device | 40a | 40b | 40c | 40d | 40e | 40f | 40e | 40f | 40c | 40d | 40a | 40b |
| Strength | x1 | x1 | x2 | x2 | x4 | x4 | x4 | x4 | x2 | x2 | x1 | x1 |

Figure 5:
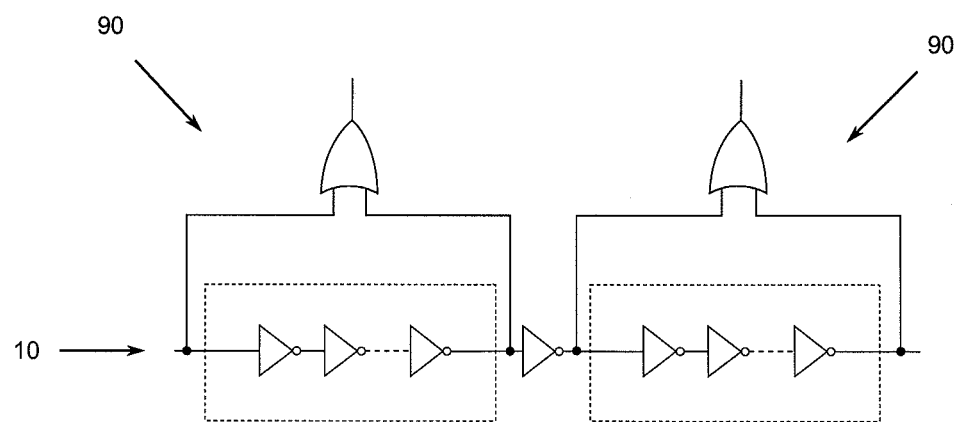
FIG. 5 shows detail of one way of incorporating one-shot circuits.

Again it will be appreciated that this circuit may be modified while still falling within the scope of the invention. For example, the one-shot circuits 90a-f may be positioned between the delay line 10 and the combinatorial logic units 100a-f instead of between the combinatorial logic units 100a-f and the devices 40a-f. The arrangement shown reduces the number of one-shots 90a-f, thereby reducing chip area and power consumption. However in the alternative arrangement it is possible to combine the one-shots 90a-f with the delay line 10 as shown in FIG. 5 which can also reduce chip area and power consumption. It will also be appreciated that the one-shots 90a-f can be omitted altogether as can the varying driver strengths (i.e. similar to the FIG. 3 arrangement).

Figure 6A:
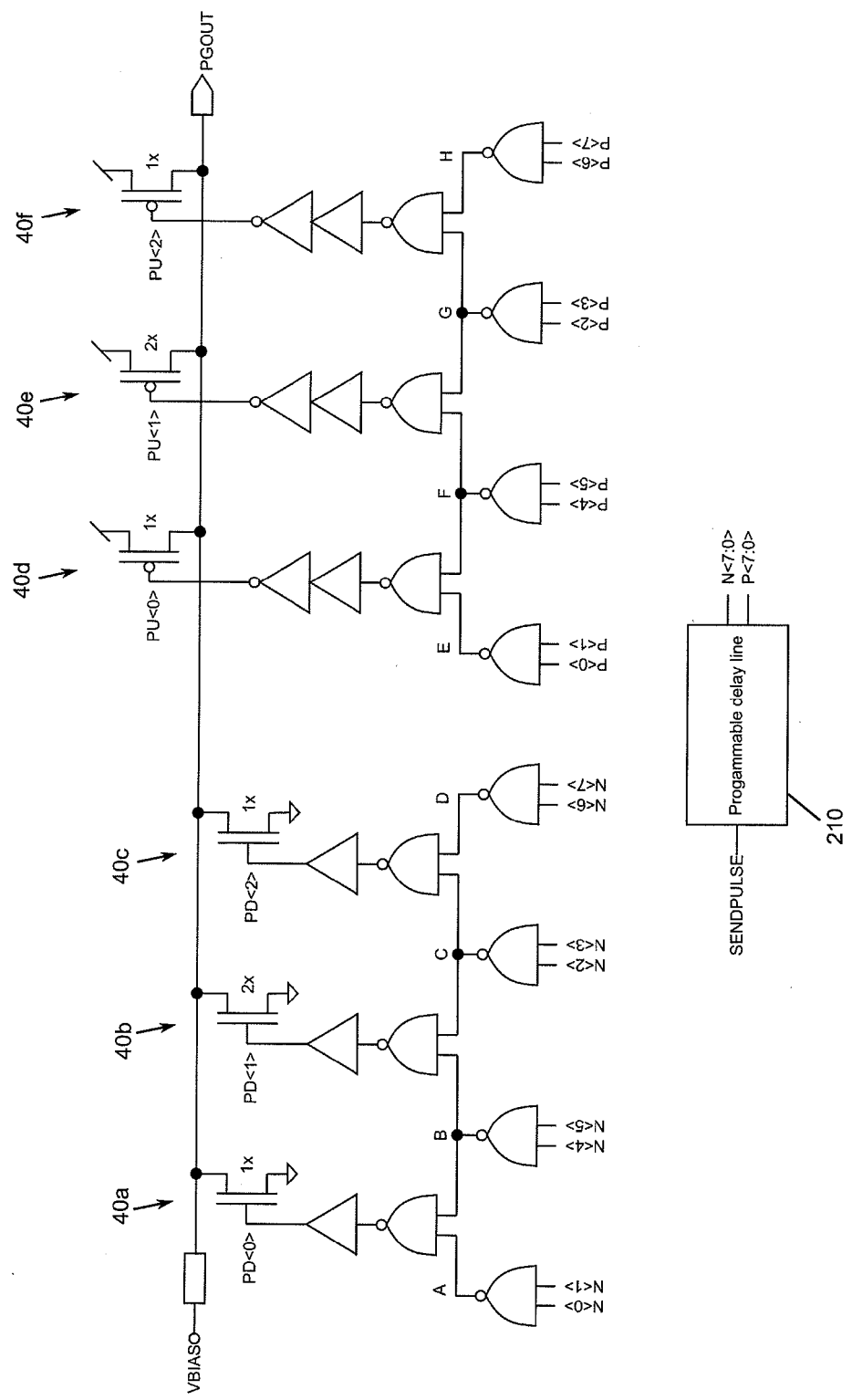
FIG. 6A shows a second embodiment of the invention.
Figure 6B:
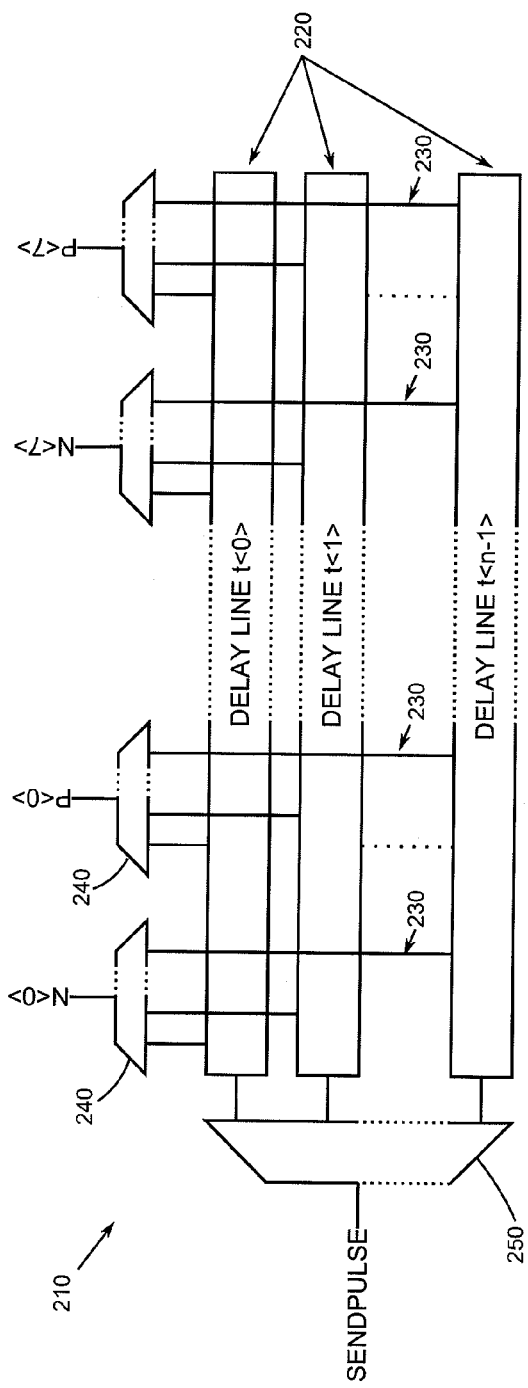
FIGS. 6B and 6C show details of the programmable delay line of the second embodiment.
Figure 6C:
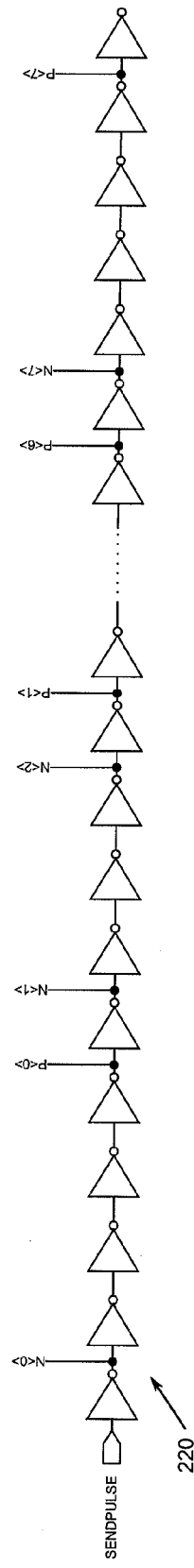

FIG. 6A shows a second embodiment of the invention. Here a programmable delay line 210 is employed. This essentially comprises a plurality of parallel tapped delay lines only one of which is selectable at a time. Details of the programmable delay line are shown in FIGS. 6B and 6C. As shown in FIG. 6B, the programmable delay line 210 is made up of a number of separate individual delay lines 220 arranged in parallel. Each delay line 220 has a series of taps 230 for use in the main circuit. Each delay line 220 necessarily has the same number of taps. The corresponding taps of each delay line are grouped together and provide inputs to a multiplexer 240. The output of each multiplexer 240 provides an output tap of the programmable delay line 210. In use, an input demultiplexer 250 is used to choose which of the individual delay lines 220 is to be used. The demultiplexer 250 directs the incoming signal (SENDPULSE) into the chosen delay line 220. This arrangement provides a way of driving the main circuit logic with different frequency delay lines (i.e. with different amounts of delay between the taps). Only one of the individual delay lines 220 is driven at any one time.

Further detail of an individual delay line 220 is shown in FIG. 6C. The delay line 220 is composed of a series of inverters which each introduce some delay to the signal.

In operation, the circuit of FIG. 6A uses pairs of delay line taps to activate and deactivate the devices 640a-f. Tap N<0> begins a signal pulse at A (and activates device 40a) and tap N<1> ends the signal pulse at A (deactivating device 40a). Similarly, tap P<0> activates device 40d and tap P<1> deactivates device 40d (at point E). It can be seen that the P<0>-P<1> pulse slightly overlaps the end of the N<0>-N<1> pulse (by one inverter length). These two pulses could instead be separated by a gap of one inverter length, but the overlap leads to less sideband noise as it smoothes the transition from pull down to pull up.

The second pull down signal is generated at C by N<2> (activation) and N<3> (deactivation) and the second pull up signal is generated at G by P<2> (activation) and P<3> (deactivation), again with a one inverter overlap. These second pulses drive two devices at the same time. The pull down pulse at C drives both devices 40b and 40c at the same time and the pull up pulse at G drives both devices 40e and 40f at the same time.

The third pull down and pull up signals (N<4>, N<5> at B, P<4>, P<5> at F) drive devices 40a and 40b or devices 40d and 40e respectively. The fourth pull down and pull up signals (N<6>, N<7> at D, P<6>, P<7> at H) drive devices 40c or 40f respectively.

It can been seen from this arrangement that the devices 40a-f are reused effectively throughout this sequence. For example device 40a is driven by the first pull down pulse and also by the third pull down pulse. Similarly, device 40b is driven by the second pull down pulse and the third pull down pulse. As illustrated, the devices have different strengths. 40a, 40c, 40d and 40f have strength 1x and devices 40b and 40e have strength 2x. By using the delay line taps to drive two devices at once, e.g. 40a and 40b in the third pulse (N<4>-N<5>), a total strength of 3x is obtained. This effectively reuses device 40a which was required for the first pulse.

Figure 7:
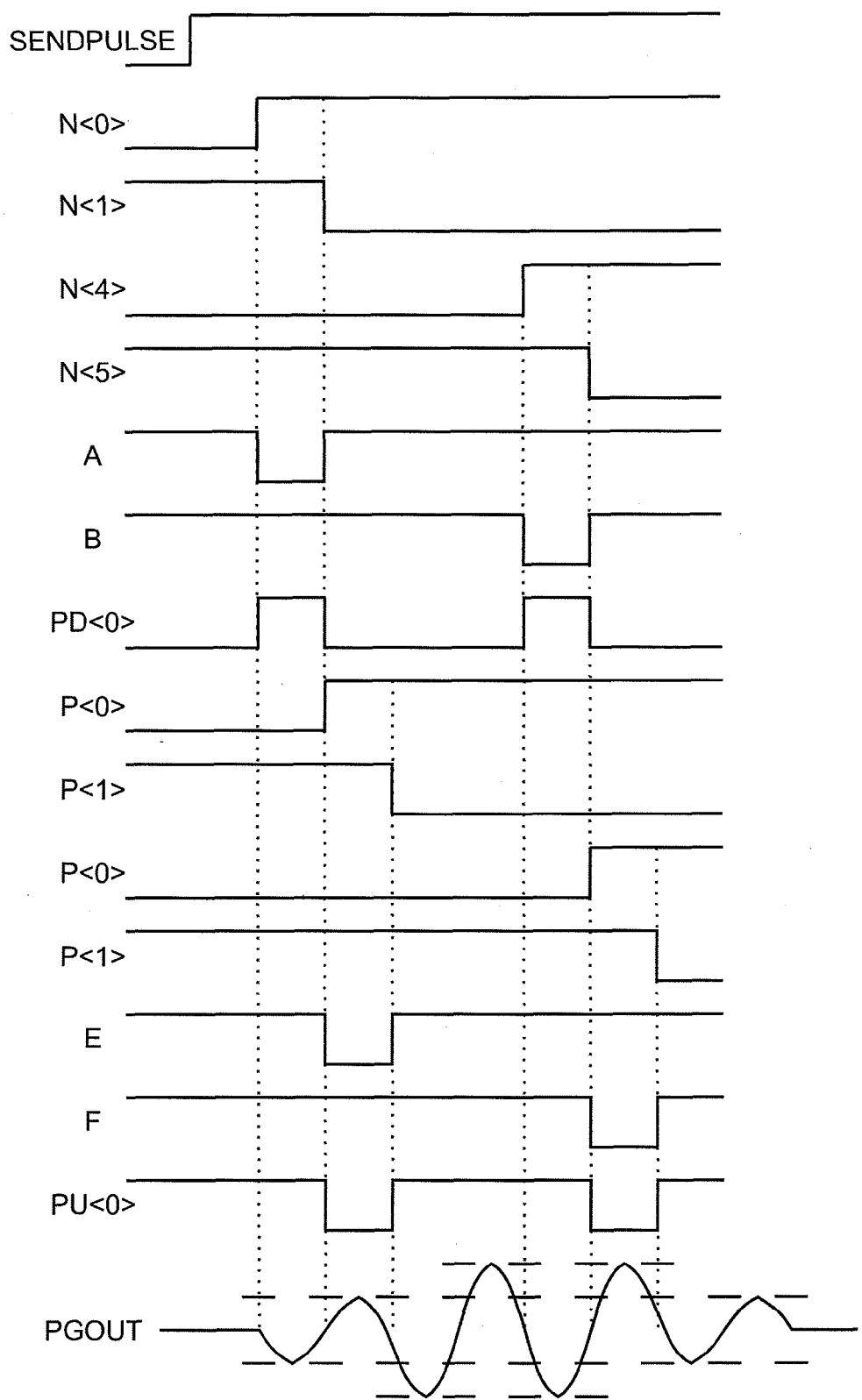
FIG. 7 shows pulse timings during operation of the second embodiment.

The timings of these pulses is illustrated in FIG. 7, although the slight overlap between the pull-up and pull-down pulses is omitted for clarity. As can be seen, N<0> and N<1> generate a pulse at A which drives pull down device 40a at PD<0>. Similarly, P<0> and P<1> generate a pulse at E which drives pull down device 40d at PU<0>. The resulting pulse output generated at PGOUT is illustrated at the bottom of the figure. The sequence is pull down 1x, pull up 1x, pull down 3x, pull up 3x, pull down 3x, pull up 3x, pull down 1x, pull up 1x. The pulse shape is an approximated Gaussian derivative of 7th order.

Figure 8A:
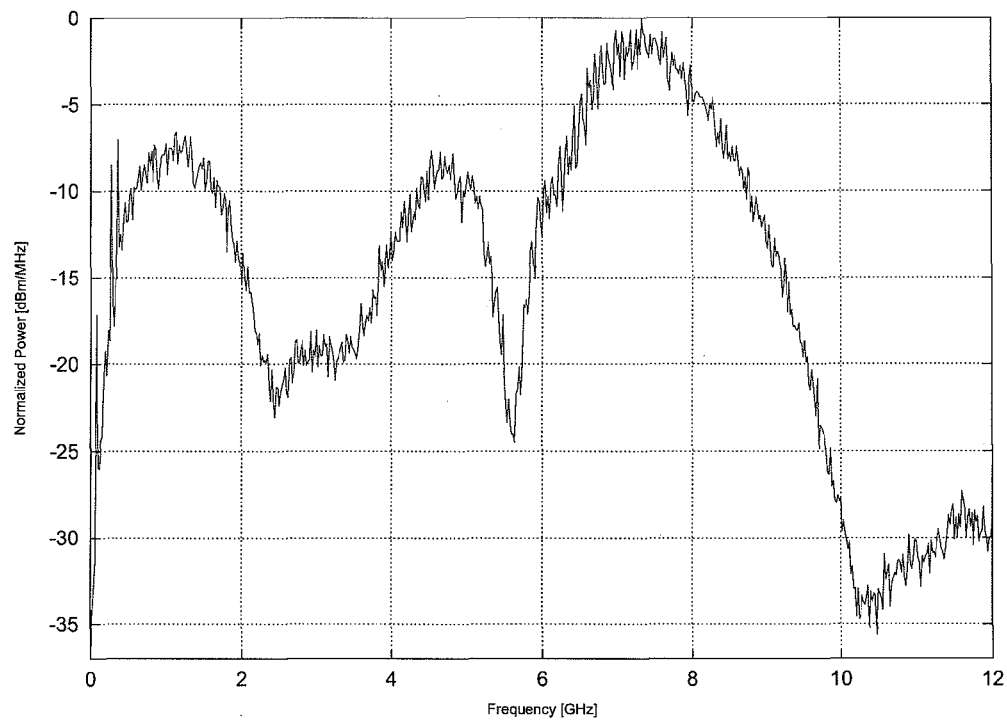
FIG. 8A shows measured outputs from the second embodiment in the frequency domain.
Figure 8B:
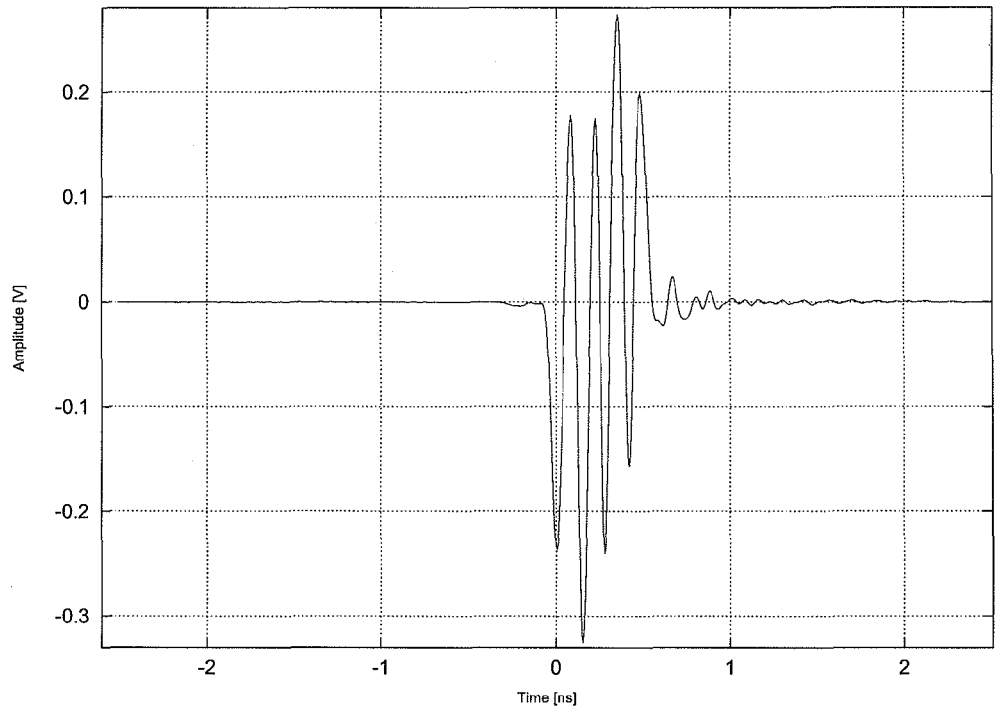
FIG. 8B shows a measured output from the second embodiment in the time domain.

FIG. 8A shows measured outputs from the circuit of FIG. 6A-C in the frequency domain. These results have been normalised to 0 dBm/MHz at the peak for clarity. The peak power is restricted to below the required limit of −41.3 dBm/MHz. It can be seen that the −10 dB bandwidth of the output fits the European UWB transmission band of 6-8.5 GHz with good spectral filling in this region. FIG. 8B shows a measurement of the transmitted pulse in the time domain. It can be seen that the circuit generates a good overall multislope pulse. Although the pulse amplitudes do not perfectly match the desired Gaussian envelope, the overall pulse shape provides good spectral filling in the desired region. The side lobes shown to the left of the main peak in FIG. 8A are the result of these mismatched amplitudes and the ringing at the end of the pulse.

Figure 9:
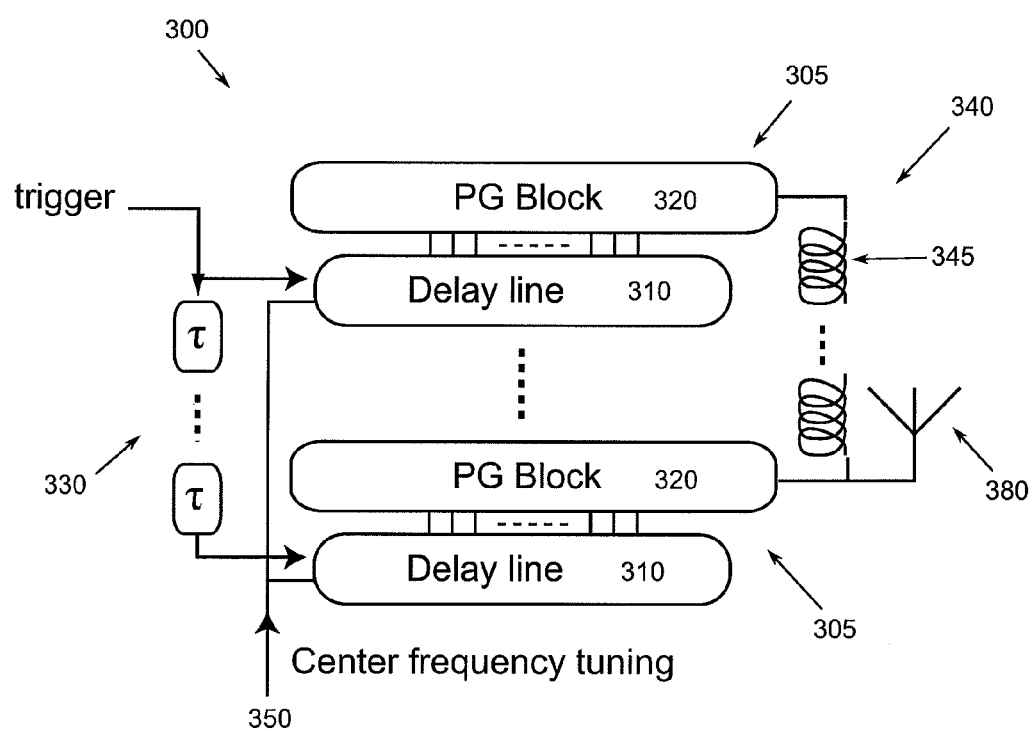
FIG. 9 shows a third embodiment of the invention.

FIG. 9 shows a third embodiment of the invention. The principle of this embodiment may be used in conjunction with any of the above embodiments or in fact with other pulse generator circuits. FIG. 9 illustrates a distributed pulse generator 300 comprising a plurality of pulse generators 305, each pulse generator comprising a delay line 310 and a pulse generator block 320 (representing the pull-up and pull-down devices together with any accompanying one-shots and/or logic circuitry). A further delay line 330 is provided for triggering each pulse generator 305 in turn. each pulse generator 305 generates a pulse (e.g. a multislope pulse such as a Gaussian derivative pulse as described above). The outputs of the pulse generators 305 feed into an inductor delay line 340, with each pulse generator output separated by an inductor 345. The inductors 345 combine the outputs of each pulse generator 305 constructively to thereby produce an amplified output at the antenna 380 which is attached to the end of the inductor delay line 340.

This distributed pulse generator addresses the problem of low supply voltage in modern electronics. The low supply voltage makes it difficult to generate sufficient output power from a single pulse generator 305, but by constructively combining several individual low voltage pulse generators 305, a higher energy output pulse can be achieved. As each individual pulse generator 305 operates at the low supply voltage, high frequency operation can still be attained.

In this embodiment, the input delay line 330 is essentially digital in nature, providing a simple trigger pulse to each of the pulse generator delay lines 310. The inductor delay line 340 is an analog delay line combining the complex analog output pulse shapes generated by each of the pulse generators 305.

FIG. 9 also shows a centre frequency tuning input 350. As above, this input may be a multiplexer input to select from among a number of prearranged delay lines or it may be a tuning input used to tune each individual delay element within each of the delay lines 320 (thereby simultaneously adjusting the centre frequencies of each delay line 320).

On account of the small chip area and low power consumption, the embodiments and modifications described above may be used in RFID tags. The transmitter of this invention is also applicable in a wide variety of other fields and the present description is not intended to be limiting to a particular application. The pulse generator can be equally well used in other Impulse Radio applications including UWB impulse radar.

The transmitter is also suitable for multiple-transmitters combined using beamforming techniques in IR-UWB radar applications. The small chip area reduces the complexity of the system and gives the possibility of implementing more complex beamforming algorithms.

The invention claimed is:

1. A pulse generator comprising:
an input for receiving a trigger;
an output node for outputting a signal;
a delay line comprising one or more delay units and a plurality of taps;
one or more pull-up devices each connected to the output node for increasing the output voltage on the output node; and
one or more pull-down devices each connected to the output node for decreasing the output voltage on the output node;
wherein the taps of the delay line are either pull-up taps arranged to drive one or more pull-up devices or pull-down taps arranged to drive one or more pull-down devices; and
wherein the taps of the delay line are operably connected to the pull-up and/or pull-down devices such that a trigger passing along the delay line activates one or more of the pull-up and/or one or more of the pull-down devices more than once.

2. The pulse generator of claim 1, comprising at least one pull-up device and at least one pull-down device.

3. The pulse generator of claim 2, wherein the delay line taps are operably connected to the pull-up and pull-down devices such that a trigger passing along the delay line causes a sequence of device activations that alternates between increasing the voltage on the output node and decreasing the voltage on the output node.

4. The pulse generator of claim 1, comprising a plurality of pull-up devices.

5. The pulse generator of claim 1, comprising a plurality of pull-down devices.

6. The pulse generator of claim 1, wherein the or each device is connected to the delay line taps such that it activates and deactivates based on a signal from the same tap.

7. The pulse generator of claim 1, wherein the or each device is connected to the delay line taps such that it activates based on the signal from one tap and deactivates based on the signal from a subsequent tap.

8. The pulse generator of claim 1, wherein combinatorial logic is provided to determine which devices are activated by which delay line taps.

9. The pulse generator of claim 8, wherein a first sequence of taps in the first half of the delay line is arranged to generate a sequence of one or more pairs of sequential device activations, each pair comprising an activation which increases the voltage on the output node and an activation which decreases the voltage on the output node, and wherein a second sequence of taps in the second half of the delay line is arranged to generate the same device activations as in the first sequence, but with the activation order arranged such that the sequence of pairs is reversed, but the sequence within each pair remains the same, said order being achieved by the combinatorial logic.

10. The pulse generator of claim 1, wherein the delay line taps are arranged to generate at least two adjacent pairs of sequential activations and wherein the pulse generator is arranged such that at least one pair of activations activates the same pull-up and pull-down devices as an adjacent pair of activations.

11. The pulse generator of claim 1, wherein a plurality of pull-up and/or pull-down devices have different strengths such that stronger devices respectively increase or decrease the output voltage more than weaker devices.

12. The pulse generator of claim 11, wherein the delay line taps are arranged such that the strongest devices are activated in the central region of the delay line and the strength of the activated devices decreases towards the ends of the delay line.

13. The pulse generator of claim 12, wherein the taps are arranged such that the strengths of the pull-up and pull-down activations form an approximate derivative Gaussian pulse shape.

14. The pulse generator of claim 13, wherein the arrangement of pull-up and pull-down activations for approximating a derivative Gaussian pulse omits activations corresponding to the outermost turning points of that derivative Gaussian pulse.

15. The pulse generator of claim 1, wherein the pull-up and pull-down devices comprise switches.

16. The pulse generator of claim 15, wherein the relative strengths of the devices are determined by the strengths of voltage controllers which are engaged and disengaged by the switches.

17. The pulse generator of claim 1, wherein the devices are transistors.

18. The pulse generator of claim 17, wherein the relative strengths of the devices are determined by the sizes of the transistors.

19. The pulse generator of claim 1, wherein one or more taps of the delay line is operably connected to a plurality of pull-up devices and/or one or more taps of the delay line is operably connected to a plurality of pull-down devices.

20. The pulse generator of claim 1, wherein each device is triggered by the output of a one-shot circuit which is itself triggered by the delay line or the combinatorial logic.

21. The pulse generator of claim 20, wherein the one-shot circuits utilize the delay units from the delay line.

22. The pulse generator of claim 1, wherein the output node is biased to a selected base potential.

23. The pulse generator of claim 1, wherein the pulse generator is included in an RFID tag.

24. The pulse generator of claim 1, wherein the pulse generator is included in an impulse radar device.

25. The pulse generator of claim 1, wherein the pulse generator is included in a radio communication transmitter.

26. A method of generating a pulse comprising:
sending a trigger along a delay line;
tapping the trigger off the delay line at a plurality of tap points; and
using the taps to drive one or more pull-up devices and one or more pull-down devices which are connected to a common output node for respectively increasing and decreasing the output voltage on the output node,
wherein the taps are arranged as either pull-up taps which drive one or more pull-up devices or pull-down taps which drive one or more pull-down devices; and
wherein the trigger activates one or more of the pull-up and/or one or more of the pull-down devices more than once.

27. The method of claim 26, wherein the trigger passing along the delay line causes a sequence of device activations that alternates between increasing the voltage on the output node and decreasing the voltage on the output node.

28. The method of claim 26, comprising driving a plurality of pull-up devices.

29. The method of claim 26, comprising driving a plurality of pull-down devices.

30. The method of claim 26, wherein the or each device is connected to the delay line taps such that it activates and deactivates based on a signal from the same tap.

31. The method of claim 26, wherein the or each device is connected to the delay line taps such that it activates based on the signal from one tap and deactivates based on the signal from a subsequent tap.

32. The method of claim 26, wherein combinatorial logic is used to determine which devices are activated by which delay line taps.

33. The method of claim 32, wherein a first sequence of taps in the first half of the delay line generates a sequence of one or more pairs of sequential device activations, each pair comprising an activation which increases the voltage on the output node and an activation which decreases the voltage on the output node, and wherein a second sequence of taps in the second half of the delay line generates the same device activations as in the first sequence, but with the activation order arranged such that the sequence of pairs is reversed, but the sequence within each pair remains the same, said order being achieved by the combinatorial logic.

34. The method of claim 26, wherein the delay line taps generate at least two adjacent pairs of sequential activations and wherein at least one pair of activations activates the same pull-up and pull-down devices as an adjacent pair of activations.

35. The method of claim 26, wherein a plurality of pull-up and/or pull-down devices have different strengths such that stronger devices respectively increase or decrease the output voltage more than weaker devices.

36. The method of claim 35, wherein the strongest devices are activated in the central region of the delay line and the strength of the activated devices decreases towards the ends of the delay line.

37. The method of claim 36, wherein the strengths of the pull-up and pull-down activations form an approximate derivative Gaussian pulse shape.

38. The method of claim 37, wherein the activations for approximating a derivative Gaussian pulse omit activations corresponding to the outermost turning points of that derivative Gaussian pulse.

39. The method of claim 26, wherein the pull-up and pull-down devices comprise switches.

40. The method of claim 39, wherein the relative strengths of the devices are determined by the strengths of voltage controllers which are engaged and disengaged by the switches.

41. The method of claim 26 wherein the devices are transistors.

42. The method of claim 41, wherein the relative strengths of the devices are determined by the sizes of the transistors.

43. The method of claim 26, wherein one or more taps of the delay line drives a plurality of pull-up devices and/or one or more taps of the delay line drives a plurality of pull-down devices.

44. The method of claim 26, wherein each device is triggered by the output of a one-shot circuit which is itself triggered by the delay line or the combinatorial logic.

45. The method of claim 44, wherein the one-shot circuits utilize the delay units from the delay line.

46. The method of claim 26, wherein the output node is biased to a selected base potential.

* * * * *